United States Patent [19]

Inoue et al.

[11] Patent Number: 5,205,900

[45] Date of Patent: Apr. 27, 1993

[54] METHOD OF MONITORING SURFACE ROUGHNESS OF CRYSTAL, AND CRYSTAL GROWTH EQUIPMENT

[75] Inventors: Kaoru Inoue, Osaka, Japan; Jean C. Harmand, Villejuif, France; Toshinobu Matsuno, Osaka, Japan

[73] Assignee: Matsushita Electric Industrial Co., Ltd., Japan

[21] Appl. No.: 702,816

[22] Filed: May 21, 1991

[30] Foreign Application Priority Data

Jun. 11, 1990 [JP] Japan .................................. 2-151998

[51] Int. Cl.⁵ .............................................. C30B 23/06
[52] U.S. Cl. ..................................... 156/601; 156/611; 156/DIG. 103; 437/105; 118/715
[58] Field of Search ..... 156/610, 601, 611, DIG. 103; 437/105; 422/105; 118/715

[56] References Cited

U.S. PATENT DOCUMENTS

| | | | |
|---|---|---|---|
| 3,892,490 | 7/1975 | Uetsuki et al. | 156/601 |
| 4,159,919 | 7/1979 | McFee et al. | 437/107 |
| 4,786,616 | 11/1988 | Awal et al. | 437/107 |
| 4,812,650 | 3/1989 | Eckstein et al. | 156/DIG. 103 |
| 4,935,382 | 6/1990 | Johnston et al. | 437/107 |

OTHER PUBLICATIONS

"Controversy of Critical Layer Thickness for In-GaAs/GaAs Strained-Layer Epitaxy" P. L. Gourley, I. J. Frits and L. R. Dawson, Applied Physics Letters, vol. 52 (1988), p. 377.

"Photoluminescence Study of Strain Relaxation in $Ga_{1-x}In_xAs$/GaAs Single Heterostructures" D. Morris, A. P. Roth, R. A. Masut, C. Lacelle and J. L. Brebner, Journal of Applied Physics, vol. 64 (1988), p. 4135.

*Primary Examiner*—Robert Kunemund
*Attorney, Agent, or Firm*—Lowe, Price, LeBlanc & Becker

[57] ABSTRACT

Changes in the formation of crystal surface roughness are monitored by making a laser beam incident on the surface of a growing crystal and detecting a reflected laser beam diffracted at the surface of the growing crystal, at a position standing apart from the optical axis of mirror face reflected light of the incident laser beam. A crystal growth equipment making use of this method is also disclosed.

3 Claims, 4 Drawing Sheets

METHOD OF MONITORING SURFACE ROUGHNESS OF CRYSTAL, AND CRYSTAL GROWTH EQUIPMENT

BACKGROUND OF THE INVENTION

1. Field of the Invention

This invention relates to a method of monitoring surface roughness of a crystal. More particularly, it is concerned with a method of in situ monitoring the form or morphology of the surface of a growing crystal when a crystal is grown on a semiconductor material by molecular beam epitaxy (MBE) or metal organic vapor phase epitaxy (MOVPE). According to this method, the surface roughness that occurs on the surface of a growing crystal can be detected in a high resolution of from a single atomic layer to several atomic layers. This invention also relates to a crystal growth equipment making use of such a method.

2. Description of the Prior Art

When a crystal of a semiconductor of the same kind or a different kind is grown on a semiconductor substrate, what is often questioned is the difference in lattice constant between the substrate and the growing crystal. If the difference in lattice constant is great, a lattice defect ascribable to the difference in lattice constant may occur even when a grown crystal is made to have a thickness of 10 nm or less, resulting in a serious lowering of the quality of the grown crystal to make it difficult to manufacture devices of practical use. If, however, the difference in lattice constant is relatively small, it is possible to make a crystal with a certain degree of layer thickness to grow without occurrence of the lattice defect. The maximum layer thickness at which a crystal can be grown without occurrence of the lattice defect is primarily determined by the combination of substrates and crystals to be grown. This layer thickness is usually called critical layer thickness.

For example, when an $In_{0.15}Ga_{0.85}As$ crystal is grown on a GaAs substrate mainly composed of (001) planes, the critical layer thickness is presumed to be about 30 nm or so. It is important for manufacturing various electrical and optical devices to accurately catch hold of this critical layer thickness according to the combination of various substrates and various crystals to be grown thereon. For such purpose, in usual instances, laborsome methods have been conventionally used such that samples with different layer thicknesses are prepared, double crystal X-ray diffraction is carried out on the respective samples to examine changes in lattice constants and the critical layer thickness is determined from the results obtained. In order to determine the critical layer thickness without preparing a number of samples with different layer thicknesses, it is necessary to find the lattice constant of a growing crystal by in situ monitoring the crystal surface while the crystal is being grown. From this point of view, some of conventional methods have employed the reflected high energy electron diffraction (RHEED) process to find lattice constants from diffraction patterns of crystals in the course of crystal growth. This method, however, is disadvantageous in that it not only requires apparatus such as a television camera, a video tape recorder, a video digitizer and a personal computer so that the line spaces of a diffraction pattern can be measured in a good precision, but also results in a poorer measurement precision when a measuring area has a smaller difference in lattice constant. Moreover, although the method according to the RHEED process can be used for the crystal growth carried out in a high vacuum as in the MBE, there is the disadvantage that it can not be used for the crystal growth carried out under the atmospheric pressure or in a low vacuum as in the MOVPE.

As discussed above, the conventional techniques have been disadvantageous such that they require fairly much labor or expensive apparatus to determine the critical layer thickness. In addition, the values themselves of critical layer thicknesses determined by these conventional methods are actually different depending on the measuring methods. Critical layer thicknesses determined by X-ray diffraction are generally larger than the values measured by RHEED. In the case of X-ray diffraction, the lattice constant to be found is a lattice constant ($a\perp$) in the direction perpendicular to the surface on which a crystal grows, and also an average value with respect to a certain degree of thickness. On the other hand, in the case of RHEED, what is found is a lattice constant ($a\|$) in the direction parallel to a growth plane on the very outward surface of a grown crystal. This difference is presumed to bring about the differences in values of critical layer thicknesses. In order to determine the critical layer thickness in a higher precision, it becomes necessary to use a more laborsome method in which a number of samples with varied thicknesses of grown crystals are prepared, the defects present in the grown crystals are counted by any method to diagram the relationship between layer thickness and lattice defect density and the critical layer thickness is determined from the results obtained.

SUMMARY OF THE INVENTION

An object of the present invention is to solve the above problems involved in the prior art and to provide a means of determining the critical layer thickness with more ease, in a higher speed and also in a better reliability.

Another object of the present invention is to provide a method by which the surface roughness ascribable to a lattice mismatch, occurring on the surface of a growing crystal can be in situ monitored in a high resolution of from a single atomic layer to several atomic layers.

To solve the above problems, the present invention does not rely on the measurement of a lattice constant of a growing crystal as in the prior art, but employs an optical means by which a semi-regular surface roughness that occurs when a crystal with a thickness larger than its critical layer thickness is grown on a semiconductor substrate is monitored by detecting changes in the intensity of reflected light of a laser beam made incident on the surface of a growing crystal. Here, a detector for detecting the reflected light does not directly detect mirror face reflected light but detects a laser beam that has been diffracted because of the semi-regular surface roughness. For this reason, the detector is provided, e.g., at a position fairly standing apart from the position of the mirror face reflected light.

More specifically, the present invention provides a method of monitoring the surface roughness of a crystal, said crystal being grown on a main plane of a first-material substrate crystal, as a second-material thin-film crystal having a lattice constant different from said first-material substrate crystal, which comprises making a laser beam incident on the surface of the second-material thin-film crystal which is growing, and detecting a reflected laser beam diffracted at the surface of the growing second-material thin-film crystal, at a position standing apart from the optical axis of mirror face reflected light of said incident laser beam.

The present invention also provides a method of monitoring the surface roughness of a crystal, said crystal being grown on a main plane of a substrate crystal having semi-regular surface roughness, which comprises making a laser beam incident on said main plane while a crystal is growing thereon, and detecting changes in the intensity of a reflected laser beam diffracted at the surface of the substrate crystal or growing crystal, at a position standing apart from the optical axis of mirror face reflected light of said incident laser beam.

The present invention still also provides a crystal growth equipment comprising a growth chamber in which crystal growth is carried out, a first view port provided in the wall of said growth chamber so that a laser beam can be made incident on the surface of a substrate crystal on which the crystal growth is carried out, a second view port provided in said wall so that mirror face reflected light of said incident laser beam, reflected on the surface of said substrate crystal, can be taken out of said growth chamber, and a third view port provided in said wall at a position standing apart from the optical axis of said mirror face reflected light of said incident laser beam so that a reflected laser beam of said incident laser beam, diffracted at the surface of said substrate crystal or the surface of a crystal growing on said substrate crystal can be monitored.

BRIEF DESCRIPTION OF THE INVENTION

DESCRIPTION OF THE PREFERRED EMBODIMENTS

Figure 1:
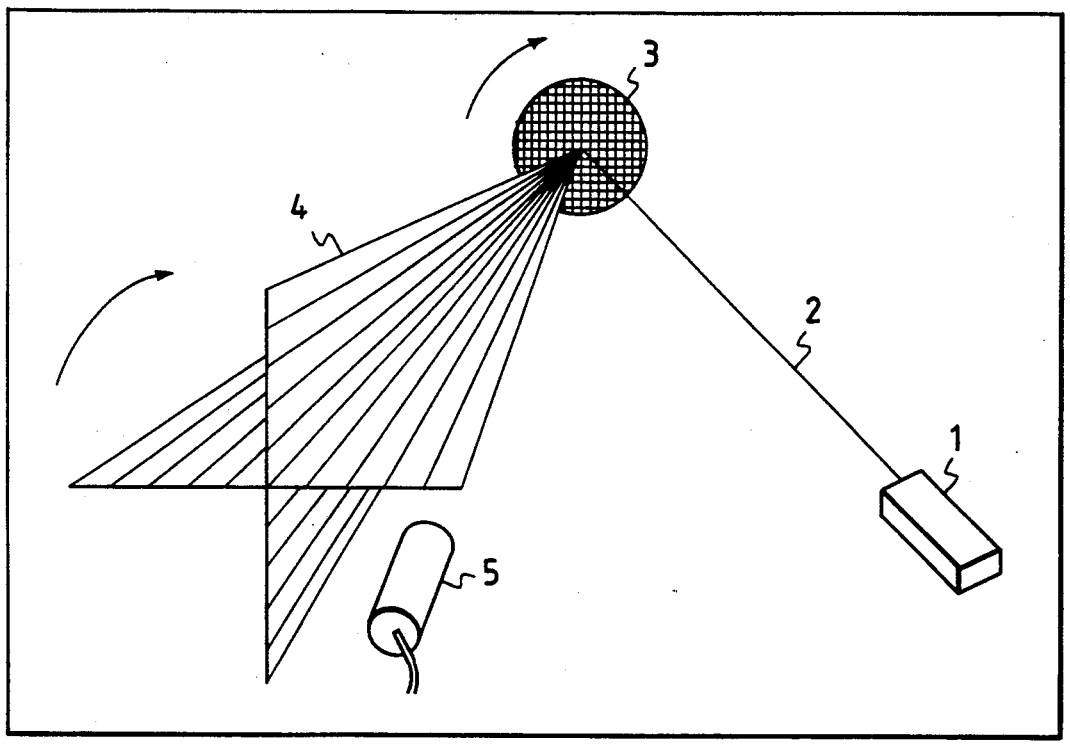
FIG. 1 is a diagrammatic illustration of the principle of the present invention.

In an embodiment, the method of the present invention can be applied when a crystal is grown in a main plane of a substrate crystal (a first material) as a thin-film crystal (a second material) having a lattice constant different from the first-material substrate crystal. In the method according to this embodiment, a laser beam is made incident on the surface of the second-material thin-film crystal which is growing, and a reflected laser beam diffracted at the surface of the growing second-material thin-film crystal is detected at a position standing apart from the optical axis of mirror face reflected light of the incident laser beam.

In the present embodiment, the method is carried out by optically detecting the semi-regular surface roughness (cross hatches) that occurs on the growing crystal surface because of a lattice mismatch. Hence, the critical layer thickness can be determined whether the sample to be measured is in vacuum or under the atmospheric pressure, and this method can be said to be a simple method that requires no special equipment. The cross hatches are presumed to appear when the energy of strain accumulated in the interior of a growing crystal become of a lattice mismatch is released to form a lattice defect (or dislocation). Hence, the layer thickness the growing crystal has at the instant of the first appearance of a cross hatch corresponds with the critical layer thickness. What is questioned is the extent to which the surface roughness can be detected using the method of the present invention. No theoretical studies have been made in detail, but the following has been experimentally confirmed: After the appearance of cross hatches on a growing crystal was detected according to the method of the present invention, the crystal was further grown to have a layer thickness twice that of the crystal on which the cross hatches appeared, and then the surface roughness on its surface was measured using a surface roughness meter. As a result, it was revealed that the grown crystal has a surface roughness of about 6 Å to 8 Å, which corresponded to the thickness of about three atomic layers of $In_{0.15}Ga_{0.85}As$. This has made it clear that the method of the present invention can detect the surface roughness due to cross-hatching, in a precision of at least three atomic layers.

Thus, according to the method of the present invention the roughness ascribable to the lattice mismatch, formed on the surface of a growing crystal can be detected in a good precision using a simple constitution for equipment, where the critical layer thickness can be determined with ease by finding the layer thickness at which this roughness begins to appear.

The present invention can be applied not only to the crystal growth carried out in a high vacuum as in the MBE process but also to other crystal growth carried out under the atmospheric pressure or in a low vacuum, and thus can enjoy a wide range of application.

According to the method of surface roughness monitoring in the above embodiment, the semi-regular surface roughness ascribable to the lattice mismatch, formed on the surface of a growing crystal can be detected in a good precision of from a single atomic layer to three atomic layers, using a simple constitution for equipment.

A laser beam is used in the present invention. Hence the present invention can be applied without regard to the atmosphere for crystal growth, and can be of wide use. There are no particular limitations on the light source of the laser beam.

The present invention is by no means limited to the crystal growth on semiconductors, and, needless to say, can be applied to the crystal growth on dielectrics or metals.

In the specific example described later, the present invention is described on the above embodiment, i.e, the method of monitoring surface roughness that occurs on the surface of a growing crystal when the crystal growth is carried out on a semiconductor substrate, using a material having a lattice constant different from that of the substrate. In another embodiment, however, the method of monitoring surface roughness of a growing crystal according to the present invention can also be applied when semi-regular roughness has been already formed on the main plane of the semiconductor substrate and a crystal is grown on the substrate crystal having semi-regular surface roughness. According to this embodiment, a laser beam is made incident on the main plane of the substrate crystal while a crystal is growing thereon, and changes in the intensity of a reflected laser beam diffracted at the surface of the substrate crystal or growing crystal are detected at a position standing apart from the optical axis of mirror face reflected light of the incident laser beam.

This embodiment can be detailed as follows: For example, in a semiconductor substrate having orientation very slightly deviated from the (001) plane, it is known that steps of a single atomic layer are semi-regularly formed at substantially constant intervals. Upon incidence of a laser beam on such a substrate, a reflected laser beam can be observed which has been diffracted because of the semi-regular steps formed on the substrate surface. When a crystal of a semiconductor of the same kind or a different kind is grown on this semiconductor substrate, the intensity of the reflected laser beam diffracted at the surface of the substrate greatly changes according to the conditions under which the crystal is grown. From the information based on such changes, it is possible to presume the mechanism of the crystal growth taking place on the surface of a growing crystal. Thus, the present invention is by no means limited to the instance in which a crystal having a lattice constant different from a substrate crystal is grown on the substrate crystal, and can also widely be applied to the instance in which the substrate have any semi-regular structures on its crystal surface.

The method of monitoring surface roughness of a crystal according to the present invention will be specifically described with reference to the accompanying drawings.

FIG. 1 diagramatically illustrates the principle of the present invention. In FIG. 1, the numeral 1 denotes a laser light source; 2, an incident laser beam; 3, a semiconductor substrate on which a crystal has grown to have surface roughness on its surface; 4, a diffracted, reflected laser beam; and 5, a photomultiplier for detecting the reflected laser beam. When, for example, an $In_{0.15}Ga_{0.85}As$ crystal is grown on a GaAs substrate mainly composed of (001) planes, a semi-regular surface roughness comes into sight on the surface of the growing crystal $In_{0.15}Ga_{0.85}As$ after the thickness of the $In_{0.15}Ga_{0.85}As$ exceeds 300 Å which is presumed to be a critical layer thickness. An experiment has confirmed that this roughness first appears in a linear fashion in the $[\bar{1}10]$ direction, and then appears also in a linear fashion in the $[\bar{1}10]$ direction, the direction falling at right angles with the $[\bar{1}10]$ direction. The surface morphology of such roughness with mesh-like lines is usually called "cross hatches". This cross hatches play a roll as a two-dimensional diffraction grating. Thus, it has been discovered that, when a laser beam is made incident on the crystal surface on which the cross hatches have appeared, the reflected light is confined in the two planes that fall at right angles with each other as shown in FIG. 1, to give a cross shape. In the case when the surface has no semi-regular roughness, there is seen only a single ray of mirror face reflected light, and hence the presence of the surface roughness can be judged from the shape of the reflected light. In order to monitor in a good precision whether or not the reflected light has spread in the cross shape, the photomultiplier 5 is provided at a position standing apart from the optical axis of the mirror face reflected light. The semiconductor substrate 3 is rotated in the direction of an arrow with in the (001) plane while it is irradiated with the laser beam, so that the cross-shaped pattern of the diffracted, reflected laser beam 4 is also rotated in the direction of an arrow when the roughness has occurred on the crystal surface and thus a diffracted laser beam is detected by the photomultiplier 5 at a certain rotated angle. What is described above is the principle of the present invention.

Figure 2:
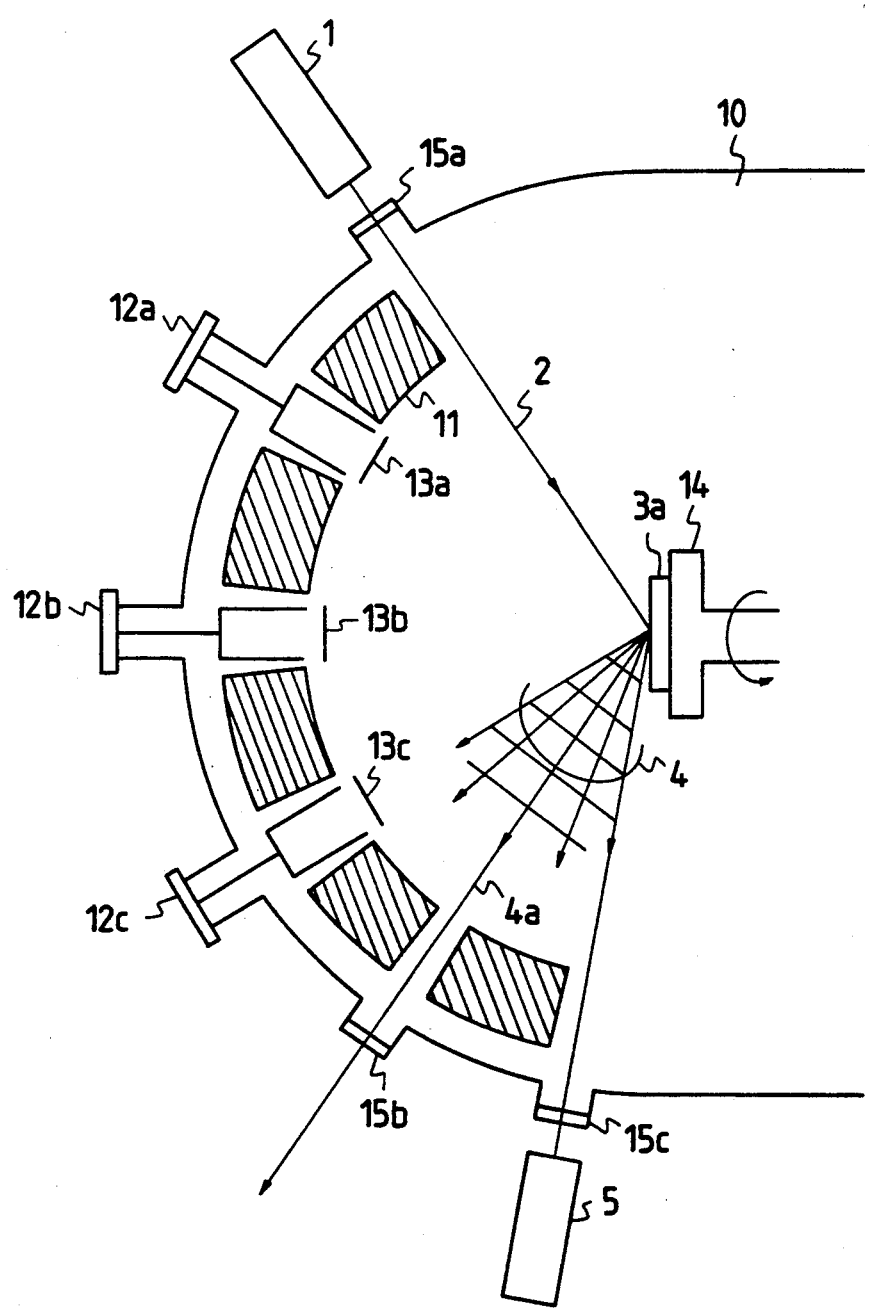
FIG. 2 is a diagrammatic cross section of an MBE apparatus, to describe an example of the present invention.

FIG. 2 is a diagrammatic cross section of an MBE apparatus, to describe an example of the present invention. In FIG. 2, the numerals 1, 2, 4, and 5 denote the same as in FIG. 1. The numeral 3a denotes a semiconductor substrate; 4a, mirror face reflected light; 10, a high-vacuum chamber; 11, a liquid nitrogen shroud; 12a, 12b and 12c, evaporation sources; 13a, 13b and 13c, cell shutters; 14, a substrate holder; and 15a, 15b and 15c, first, second and third view ports, respectively. The evaporation sources 12a, 12b and 12c are sources from which crystal materials are evaporated. The cell shutters 13a, 13b and 13c, are provided for the respective evaporation sources. The substrate holder is rotatably provided to hold thereon a substrate on which a crystal is grown. The members denoted by the numerals 10 to 14 constitute a growth chamber for an MBE apparatus conventionally available.

Figure 3:
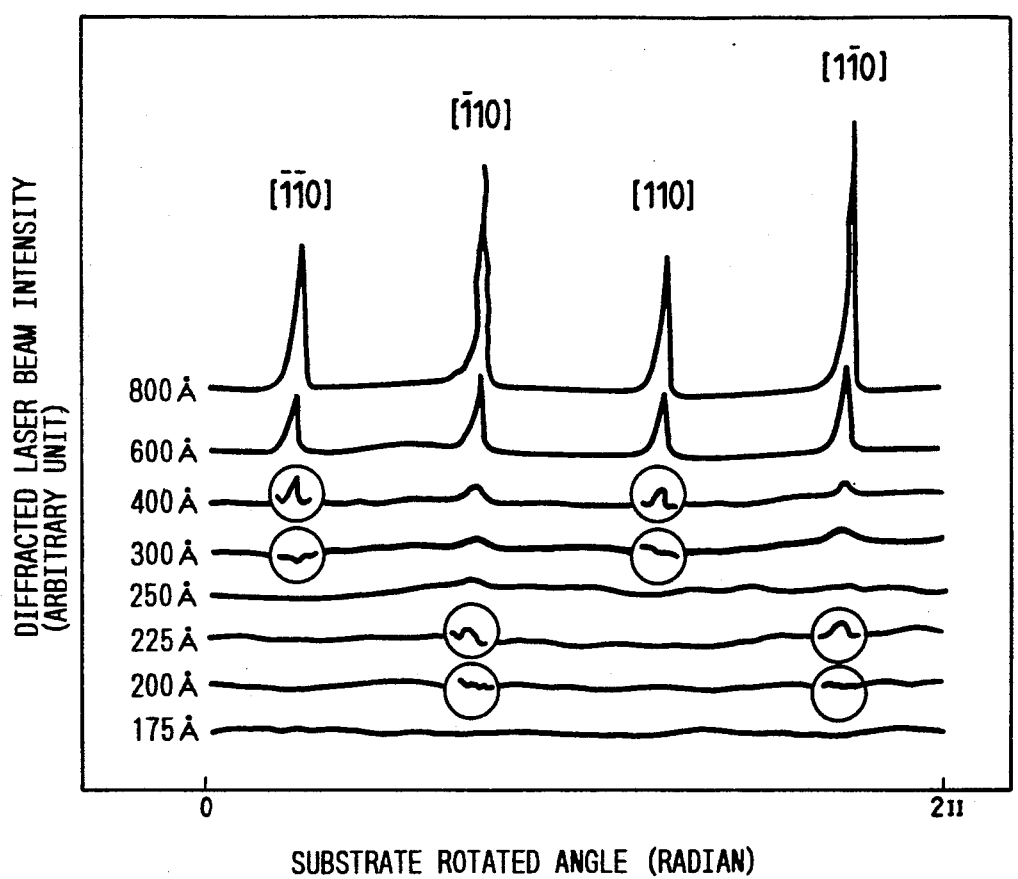
FIG. 3 shows the relationship between the intensity of a diffracted, reflected laser beam detected according to the present invention and the angle at which a substrate is rotated.

To experimentally carry out the surface roughness monitoring method of the present invention, the first view port 15a through which the laser beam emitted from the laser light source 1 is made incident on the surface of the semiconductor substrate 3a, the second view port 15b through which the mirror face reflected light 4a of the incident laser beam 2 is let to pass outside the apparatus and the third view port 15c through which part of the reflected laser beam 4 diffracted because of the surface roughness on the semiconductor substrate 3a or a crystal growing on said substrate were provided as shown in FIG. 2. The semiconductor substrate 3a actually used in the experiment was a GaAs substrate mainly composed of the (001) plane. An $In_x$-$Ga_{1-x}As$ crystal having a lattice constant different from that of GaAs was grown on this GaAs substrate. In respect of the region in which the InAs composition X is 0.2 or less, the laser beam was made incident on the surface of a growing crystal while the $InGa_xGa_{1-x}As$ crystal was growing, and the diffracted laser beam 4 was detected with the photomultiplier 5 at the position of the third view port 15c. FIG. 3 shows an example in which the relationship between the intensity of the diffracted, reflected laser beam and the angle at which the substrate is rotated was measured on the $In_x$-$Ga_{1-x}As$ crystal with varied layer thicknesses.

In the example shown in FIG. 3, X is set to be 0.175. Since the crystal surface is very flat until the layer thickness of $In_{0.175}Ga_{0.825}As$ reaches 175 Å, no reflected laser beam is observed from the third view port 15c. When the layer thickness reaches 200 Å, signals of slight reflected light begin to be detected. It is seen that the intensities of the signals increase with an increase in the layer thickness and the signals appear at the positions of given angles at which the substrate is rotated. When the layer thickness exceeds 300 Å, new signals are observed at the positions set aside by 90° in terms of the rotated angle. In this way, four peaks at intervals of 90° in the substrate rotated angle of from 0° to 360° C. can be clearly monitored in the region of the larger layer thickness. In FIG. 3, the signals shown in circles are magnified five times the signals of others. In the region in which the layer thickness of $In_{0.175}Ga_{0.825}As$ is 200 Å to 250 Å, the semi-regular roughness occurs on the crystal surface in the $[\bar{1}10]$ direction, and when the layer thickness is 300 Å or more the semi-regular roughness also occurs in the [$\bar{1}10$] direction. This has been revealed by optical microscopic observation. This roughness is presumed to occur when the strain produced in the grown crystal because of a lattice mismatch is relaxed as a result of the formation of dislocation of its energy. Hence the layer thickness at which the laser beam diffracted because of the semi-regular roughness occurred on the crystal surface begins to be detected (about 200 Å in this instance) can be presumed to correspond with the critical layer thickness.

Figure 5:
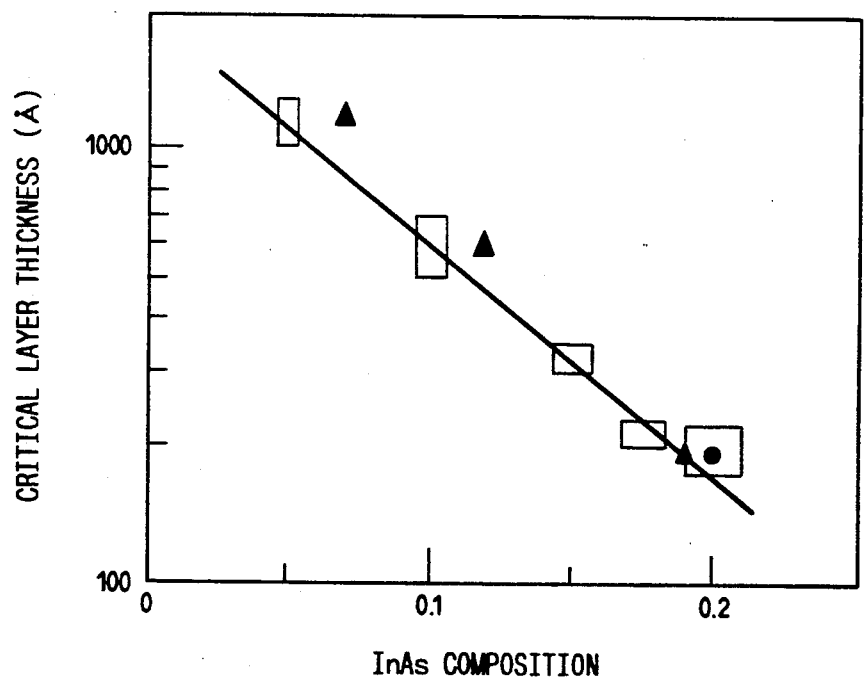
FIG. 5 shows the relationship between the critical layer thickness of $In_xGa_{1-x}As$ on a GaAs substrate, determined according to the present invention, and the composition X of InAs.

FIG. 5 shows InAs composition dependence of the critical layer thickness determined by carrying out similar experiments on various InAs compositional values X. Taking account of the tolerance of experimental errors, the values shown by square regions are values determined by the method of the present invention. The values shown by a black circle and black triangles are those reported in publication 1 (P. L. Gourley, I. J. Frits and L. R. Dawson, Applied Physics Letters, Vol. 52 (1988), p. 377) and publication 2 (D. Morris, A. P. Roth, R. A. Masut, C. Lacelle and J. L. Brebner, Journal of Applied Physics, Vol. 64 (1988), p. 4135), respectively. In these publications, the method used relies not on the measurement of changes in lattice constants but on the determination of the layer thickness at which the dislocation begins to occur. Hence, the data obtained can be considered reliable. The values determined by the method of the present invention and the values determined in these publications are in very good agreement. Thus, the method of the present invention can be considered to be capable of giving reliable data.

Figure 4:
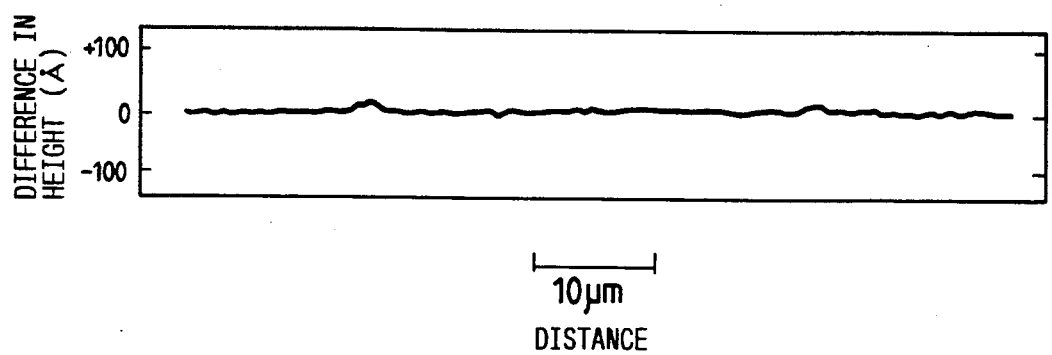
FIG. 4 shows the relationship between the height and distance of a roughness having appeared on a crystal surface.

FIG. 4 shows results obtained by measuring with a surface roughness meter Talystep (trade name; manufactured by Rank Taylor Hobson, Inc.) the roughness that occurred on the surface of a sample comprising a GaAs substrate on which an $In_{0.15}Ga_{0.85}As$ crystal was grown in a thickness of 600 Å exceeding the critical layer thickness. In this sample, it was confirmed that a surface roughness of about 6 Å to 8 Å in height occurred at intervals of about 20 μm. This shows that the method of the present invention can detect the surface roughness in a high precision of from a single atomic layer to three atomic layers.

The diagrammatic view of an example in which the method of the present invention is applied in an actual MBE apparatus has been shown in FIG. 2. What is most important to improve the measurement precision is to cause in the MBE apparatus no irregular reflection of the mirror face reflected light 4a of the incident laser beam 2. For this purpose, the apparatus is provided with the second view port 15b so that the mirror face reflected light 4a can be led outside the apparatus. The diffracted, reflected laser beam is of course undesirable since it causes stray light (parasitic reflection of the laser beam) in the apparatus. Since, however, its intensity is fairly smaller than that of the mirror face reflected light, a sufficiently good measurement precision can be obtained if only the mirror face reflected light is let to pass outside the apparatus. This has been made clear from the experiments.

What is claimed is:

1. A method of monitoring the surface roughness of a crystal, said crystal being grown on a main plane of a first-material substrate crystal provided on a surface of a rotatable substrate holder in a vacuum chamber, said surface generally perpendicular to an axis of said rotatable substrate holder, said crystal grown as a second-material thin-film crystal being different from said first-material substrate crystal, which comprises making a laser beam incident on the surface of the second-material thin-film crystal which is growing, and detecting a diffracted laser beam from the surface of the second-material thin-film crystal by a diffracted laser beam-detecting device provided at a position standing apart from the optical axis of mirror face reflected light of said incident laser beam while rotating the substrate holder about said axis, to detect the change in the intensity of the diffracted laser beam.

2. The method according to claim 1 including the step of providing on an irregular surface roughness on the first-material crystal substrate prior to growing said crystal.

3. A crystal surface roughness-monitoring equipment comprising:
   a vacuum chamber;
   a substrate holder having a surface and an axis generally perpendicular to said surface provided in the vacuum chamber;
   at least one crystal growth vessel for carrying out growth of a crystal on a substrate provided on the surface of the substrate holder, said crystal being composed of a material different from the material of the substrate;
   a first view port provided in the wall of the vacuum chamber;
   a laser beam source for irradiating the crystal with a laser beam through the first view port;
   a second view port provided in the wall of the vacuum chamber at a position standing apart from the optical axis of a mirror face reflected light of the laser beam,
   a detecting device for detecting a diffracted laser beam which is diffracted at the crystal surface, through the second view port;
   wherein the crystal surface roughness is monitored by carrying out the growth of the crystal on the substrate, detecting the diffracted laser beam while rotating the substrate, and monitoring the change in the intensity of the diffracted laser beam to monitor the surface roughness of the crystal growing on the substrate.

* * * * *